(12) United States Patent
Lin et al.

(10) Patent No.: US 10,411,085 B2
(45) Date of Patent: Sep. 10, 2019

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Yu-Chiun Lin, Taipei (TW); Po-Nien Chen, Miaoli (TW); Chen Hua Tsai, Hsinchu County (TW); Chih-Yung Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/593,479

(22) Filed: May 12, 2017

(65) Prior Publication Data

US 2018/0190754 A1 Jul. 5, 2018

Related U.S. Application Data

(60) Provisional application No. 62/440,081, filed on Dec. 29, 2016.

(51) Int. Cl.
*H01L 27/06* (2006.01)
*H01L 49/02* (2006.01)
(Continued)

(52) U.S. Cl.
CPC ........ *H01L 28/24* (2013.01); *H01L 21/32051* (2013.01); *H01L 23/5228* (2013.01); *H01L 27/0207* (2013.01); *H01L 27/0629* (2013.01); *H01L 29/1079* (2013.01); *H01L 29/1095* (2013.01); *H01L 21/823431* (2013.01); *H01L 21/823493* (2013.01); *H01L 29/66545* (2013.01); *H01L 29/7851* (2013.01)

(58) Field of Classification Search
CPC .. H01L 28/24; H01L 27/1116; H01L 27/0629; H01L 27/101; H01L 29/6681; H01L 29/0696; H01L 23/5228; H01L 29/1079; H01L 27/0207
See application file for complete search history.

(56) References Cited

U.S. PATENT DOCUMENTS 6,046,484 A * 4/2000 Kodaira ................ H01L 27/105
257/408
6,130,139 A * 10/2000 Ukeda ............... H01L 21/76232
257/E21.549
(Continued)

FOREIGN PATENT DOCUMENTS

CN 103325844 A 9/2013
KR 10-2016-0009430 A 1/2016

*Primary Examiner* — Latanya N Crawford
(74) *Attorney, Agent, or Firm* — McDermott Will & Emery LLP

(57) ABSTRACT

A semiconductor device includes a substrate having a first conductivity type, a first well formed in the substrate and having a second conductivity type, a first diffusion region formed in the first well and having the first conductivity type, a first interlayer dielectric layer disposed over the first well and the first diffusion region, and a resistor wire formed of a conductive material and embedded in the first interlayer dielectric layer. The resistor wire overlaps the first diffusion region and at least partially overlaps the first well in plan view.

19 Claims, 11 Drawing Sheets

(51) Int. Cl.
  *H01L 29/10*      (2006.01)
  *H01L 27/02*      (2006.01)
  *H01L 21/3205*    (2006.01)
  *H01L 23/522*     (2006.01)
  *H01L 21/8234*        (2006.01)
  *H01L 29/78*          (2006.01)
  *H01L 29/66*          (2006.01)

(56) References Cited

U.S. PATENT DOCUMENTS

| | | | | |
|---|---|---|---|---|
| 2002/0060351 | A1* | 5/2002 | Shin | H01L 27/0688 |
| | | | | 257/536 |
| 2004/0124477 | A1* | 7/2004 | Minami | H01L 27/0629 |
| | | | | 257/379 |
| 2004/0245575 | A1* | 12/2004 | Beach | H01L 23/5226 |
| | | | | 257/359 |
| 2005/0095779 | A1* | 5/2005 | Park | H01L 21/76838 |
| | | | | 438/238 |
| 2007/0259494 | A1* | 11/2007 | Park | H01L 21/76838 |
| | | | | 438/238 |
| 2010/0308341 | A1* | 12/2010 | Suda | H01L 21/8213 |
| | | | | 257/77 |
| 2014/0084381 | A1* | 3/2014 | Yeh | H01L 27/0629 |
| | | | | 257/380 |
| 2014/0246730 | A1* | 9/2014 | Hung | H01L 27/0629 |
| | | | | 257/379 |
| 2016/0020148 | A1* | 1/2016 | Song | H01L 27/0629 |
| | | | | 438/238 |
| 2017/0221821 | A1* | 8/2017 | Hu | H01L 23/5227 |

\* cited by examiner

SEMICONDUCTOR DEVICE AND A METHOD FOR FABRICATING THE SAME

CROSS-REFERENCE TO RELATED APPLICATIONS

This application claims priority to U.S. Provisional Patent Application 62/440,081 filed Dec. 29, 2016, the entire disclosure of which is incorporated herein by reference.

TECHNICAL FIELD

The disclosure relates to a method for manufacturing a semiconductor device, and more particularly to a structure and a manufacturing method for a resistor wire over underlying structures.

BACKGROUND

In a semiconductor device, such as an integrated circuit (IC) or a large scale integration (LSI), many resistors are used. Some of the resistors are diffusion regions formed in a substrate and some of the resistors are conductive layers formed in upper layers above the underlying structures. With decreasing semiconductor device dimensions, reduced parasitic capacitance of the resistors is required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
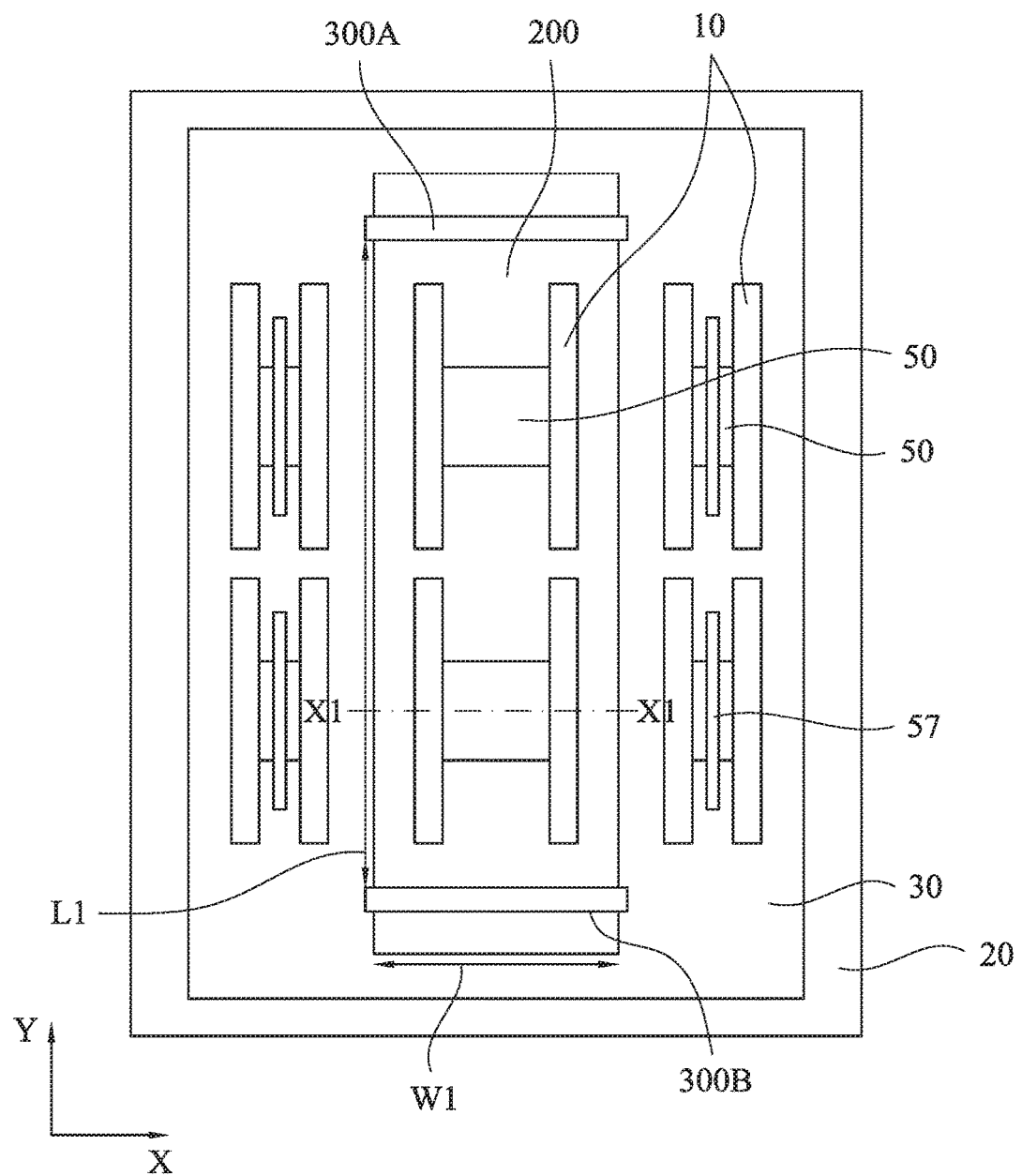
FIGS. 1A-1C show various layouts (plan view) of a semiconductor device according to embodiments of the present disclosure.
Figure 1B:
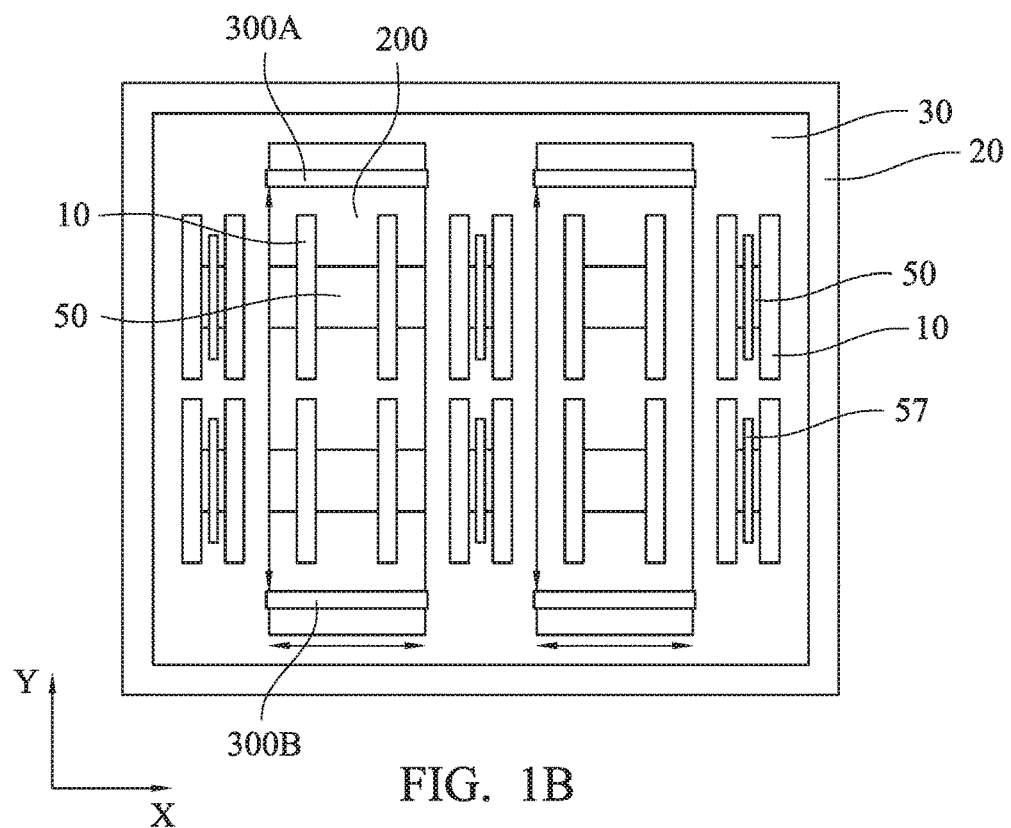
Figure 1C:
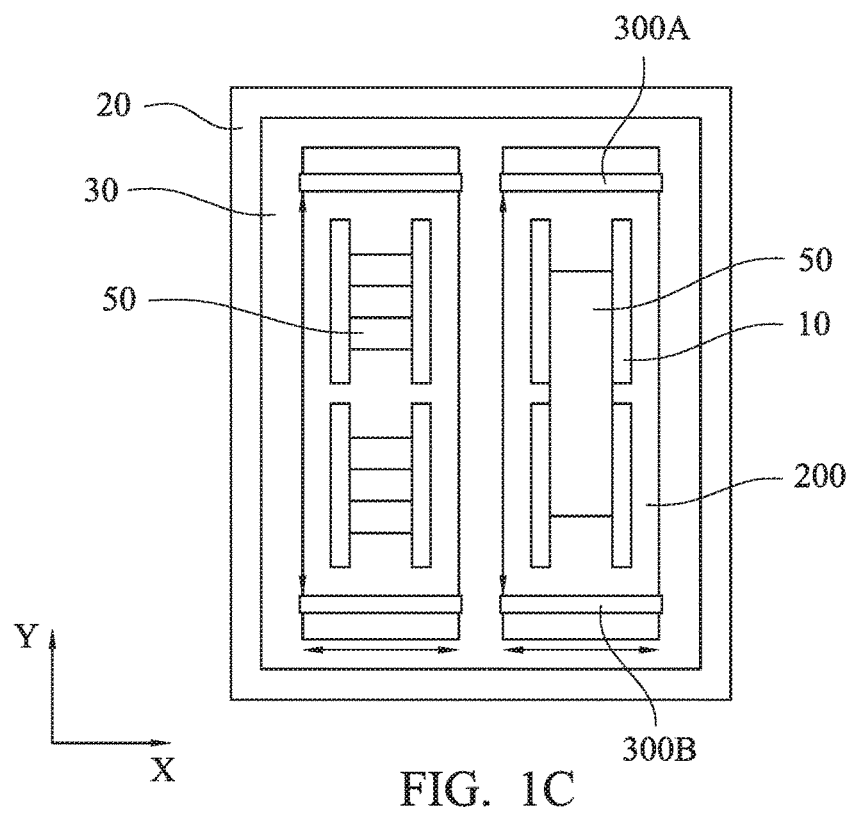
Figure 2:
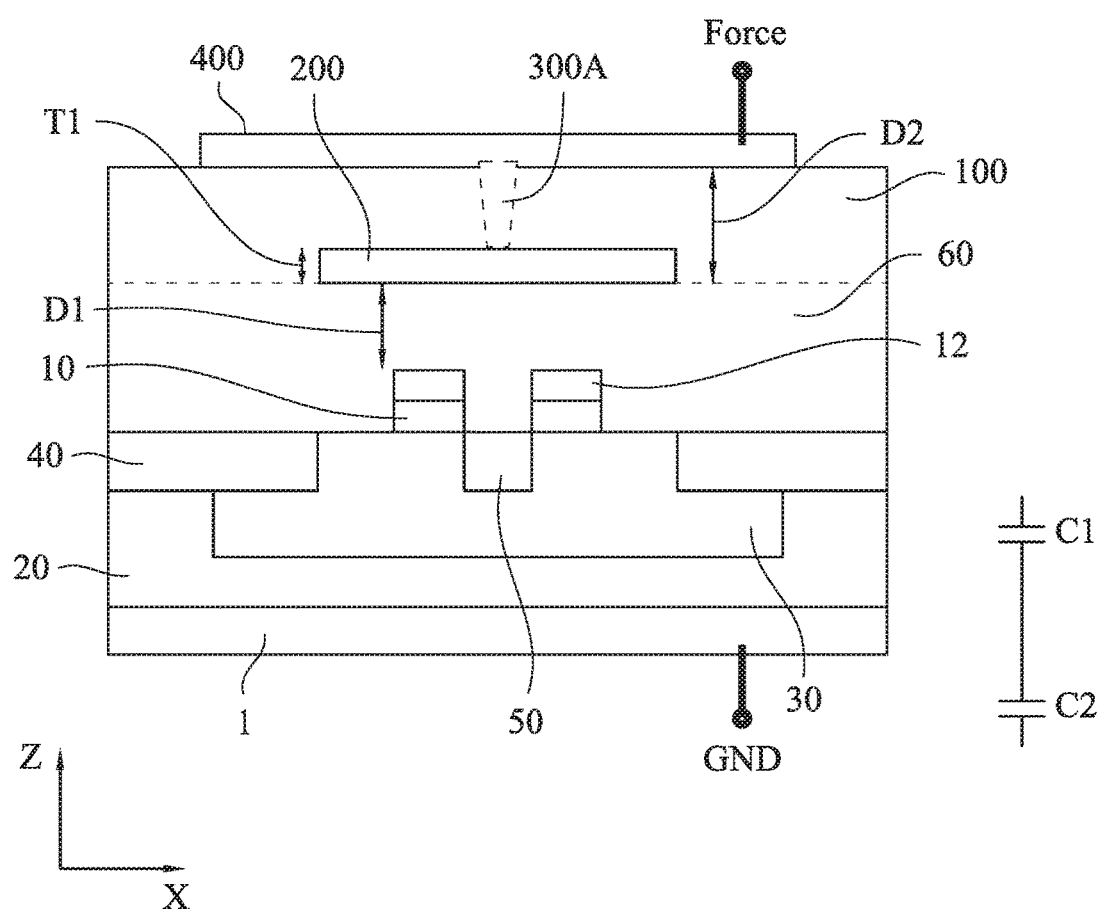
FIG. 2 shows a cross sectional view of a semiconductor device according to embodiments of the present disclosure.

FIG. 1A shows a plan view (viewed from the above) illustrating a layout structure of a semiconductor device according to embodiments of the present disclosure. FIGS. 1B and 1C show other layout structures according to embodiments of the present disclosure. FIG. 2 shows a cross sectional view corresponding to line X1-X1 of FIG. 1A.

In FIG. 1A, a resistor wire 200 extending in the Y direction is provided. The resistor wire 200 is made of a conductive material, such as a metal, a metal alloy or a metal nitride. Since the resistor wire 200 is a resistor, the conductivity of the resistor wire 200 is relatively low compared with other wires for transferring signals. The resistivity of the resistor wire 200 is in a range from about 1 Ω/☐ to about 1000 Ω/☐, in some embodiments. The material for the resistor wire 200 includes, for example, TiN, TaN or TiSiN.

The size and thickness of the resistor wire 200 may vary depending on the purposes or applications of the resistor wire 200. In some embodiments, the thickness T1 of the resistor wire 200 (see, FIG. 2) is in a range from about 1 nm to about 10 nm, and is in a range from about 3 nm to about 6 nm in other embodiments. The width W1 of the resistor wire 200 is in a range from about 20 nm to about 200 nm, and is in a range from about 40 nm to about 100 nm in other embodiments.

As shown in FIGS. 1A and 2, the resistor wire 200 includes contacts (or vias) 300A and 300B for the resistor wire 200 to be connected to another circuit element via upper layer metal wires 400. In some embodiments, only two contacts 300A and 300B are provided on the resistor wire 200. In other embodiments, four contacts are provided, two of which are arranged adjacent to each other and used to provide a current flow therebetween and the remaining two of which are arranged adjacent to each other and are used to measure a voltage or obtain a voltage drop. The length L1 of the resistor wire 200 (distance between contacts 300A and 300B) is in a range from about 100 nm to about 10 μm in some embodiments, and is in a range from about 200 nm to about 5 μm in other embodiments.

As shown in FIGS. 1A and 2, just under the resistor wire 200, one or more dummy structures 10 (e.g., dummy gate structures) and one or more first diffusion regions 50 are disposed over a substrate 1. In some embodiments, a first well 20 (e.g., P-well) is formed in a p-type substrate 1, and a second well 30 (e.g., N-well) is formed in the first well 20. The conductivity type of the first well 20 is the same as the conductivity type of the substrate 1 and is different from the conductivity type of the second well 30. In certain embodiments, the first well 20 is not formed and the second well 30 is formed in the substrate 1.

In some embodiments, the first and/or second wells are part of the substrate 1 for planar type FETs formed by, for example, one or more ion implantation operations and/or one or more thermal diffusion operations. In other embodiments, the first and/or second wells are fin structures disposed over the substrate 1. In certain embodiments, at least the second well 30 is one or more dummy fin structures extending in the X direction.

The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

As shown in FIGS. 1A and 2, the resistor wire 200 fully overlaps the dummy gate structures 10 and the first diffusion region 50 in plan view. Further, the resistor wire 200 at least partially overlaps the first and second wells 20, 30. Each of the dummy gate structures 10 may include a dummy gate dielectric layer and a dummy gate electrode layer. In the present disclosure, a dummy "element" means that the "element" has no electrical function or is not part of a functioning circuit, and "a plan view" means a view along the normal line (the Z direction) of the substrate 1 toward the substrate 1 from above. In some embodiments, a gate cap insulating layer 12 is provided on the dummy gate structure 10.

In one embodiment, plural dummy gate structures 10 are disposed over the second well 20. The number of the dummy gate structures may be as small as one per resistor wire and more than two dummy gate structures may be provided. In FIG. 2, two dummy gate structures are shown, but the number of the dummy gate structures under the resistor wire 200 along the X direction is not limited to two. The plural dummy gate structures 10 extend in the Y direction and are arranged in the X direction. For example, as shown in FIG. 1A, the dummy gate structures 10 are disposed in a 2×2 matrix under the resistor wire 200 in some embodiments. As shown in FIG. 1A, the resistor wire 200 overlaps all three dummy gate structures in plan view.

In plan view, the dummy gate structures 10 are disposed between a pair of contacts 300A and 300B, and thus the contacts do not overlap the dummy gate structures 10. In other embodiments, however, at least one of the contacts overlaps the dummy gate structures 10.

The first diffusion regions 50 are also disposed between the pair of contacts 300A and 300B, in plan view. The dimension of the first diffusion region 50 along the Y direction is smaller than the dimension of the dummy gate structure 10 along the Y direction in some embodiments, and may be equal to or greater than the dimension of the dummy gate structure 10. In FIG. 1A, one first diffusion region 50 is sandwiched by two dummy gate structures 10 in plan view. In other embodiments, multiple (e.g., 2, 3, 4, . . . ) first diffusion regions 50 are sandwiched by two dummy gate structures 10 in plan view, as shown in FIG. 1C. In certain embodiments, one first diffusion region 50 is sandwiched two or more pairs of dummy gate structures 10 in plan view, as shown in FIG. 1C.

Further, the first diffusion regions 50 are disposed not only between two adjacent dummy gate structures 10 but also at one or more of the opposite sides of respective dummy gate structures 10, as shown in FIG. 1B. In some embodiments, the first diffusion region 50 is a doped epitaxial layer with or without a silicide layer.

In FIG. 1A, outside the resistor wire 200, dummy gate structures 10 are disposed. In some embodiments, active FET's may be disposed instead of dummy structures. In some embodiments, a contact layer 57 made of a conductive material is formed over the first diffusion region 50.

In FIG. 1B, two sets of resistor wires 200 are disposed with dummy gate structures interposed therebetween, in plan view. In some embodiments, the active FET's may be interposed between the two sets of resistor wire. The space between the adjacent two resistor wires 200 is in a range from about 10 nm to about 2 μm in some embodiments. Further, in FIG. 1C, two resistor wires 200 are disposed adjacent to each other without interposing dummy gate structures therebetween. The space between the adjacent two resistor wires 200 is in a range from about 50 nm to about 1 μm in some embodiments.

As shown in FIG. 2, in some embodiments, isolation insulating layers (shallow trench isolation, STI) 40 are also disposed in the first and second wells 20, 30. In FIGS. 1A-1C, the isolation insulating layer 40 is omitted for simplicity. Further, a first interlayer dielectric (ILD) layer 60 is formed over the dummy gate structures 10 in some embodiments. The dummy gate structures 10 may be embedded in the first ILD layer 60. A second ILD layer 100 is further disposed over the first ILD layer 60, and the resistor wire 200 is embedded in the second ILD layer 100 in some embodiments. The distance D1 between the upper surface of the gate cap insulating layer 12 and the bottom of the resistor wire 200 is in a range from about 5 nm to 20 nm in some embodiments. The distance D2 between the bottom of the resistor wire 200 and the bottom of the upper layer metal wires 400 (the same as the thickness of the second ILD layer 100) is in a range from about 10 nm to 50 nm in some embodiments.

The contacts 300A and 300B are formed in the second ILD layer 100 in some embodiments. In other embodiments, the resistor wire 200 is formed in one of upper ILD layers formed above the second ILD layer 100 and the contacts 300A and 300B are formed in one of the upper ILD layers disposed above the second ILD layer 100.

In some embodiments, the substrate 1 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

In some embodiments, the first well 20 is a p-type well doped with $BF_2$ and/or In with doping concentration about $1\times10^{13}$ to about $5\times10^{13}$ atoms/cm$^3$. The concentration is about $2.5\times10^{13}$ to about $3\times10^{13}$ atoms/cm$^3$ inn other embodiments.

In some embodiments, the second well 30 is an n-type well doped with As and/or P with doping concentration about $1\times10^{13}$ to about $1\times10^{14}$ atoms/cm$^3$. The concentration is about $4\times10^{13}$ to about $5\times10^{13}$ in other embodiments. The implantation energy is about 40 keV to about 150 keV in some embodiments. The second well 30 is electrically floating in some embodiments.

In some embodiments, the first diffusion region 50 is a heavily-doped p-type (P$^+$) well doped with $BF_2$ and/or In with doping concentration about $1\times10^{14}$ to about $1\times10^{16}$ atoms/cm$^3$. The concentration is about $5\times10^{14}$ to about $5\times10^{15}$ atoms/cm$^3$ in other embodiments.

With the foregoing structure, two capacitances C1 and C2 are formed and are connected in series. The first capacitance C1 is formed between the resistor wire 200 and the first diffusion region 50 (e.g., p-type), and the second capacitance C2 is formed between the first diffusion region 50 and the second well 30 (e.g., n-type) and/or the first well 20 (e.g., p-type) (and the substrate (e.g., p-type)). The series-connected capacitances can reduce the overall parasitic capacitance between the resistor wire 200 and the substrate 1.

In some embodiments, the parasitic capacitance between the resistor wire 200 and the substrate 1 can be reduced by 44% compared with the case where the second well 30 is a p-type, the same as the first well 20 and the substrate 1.

Figure 3:
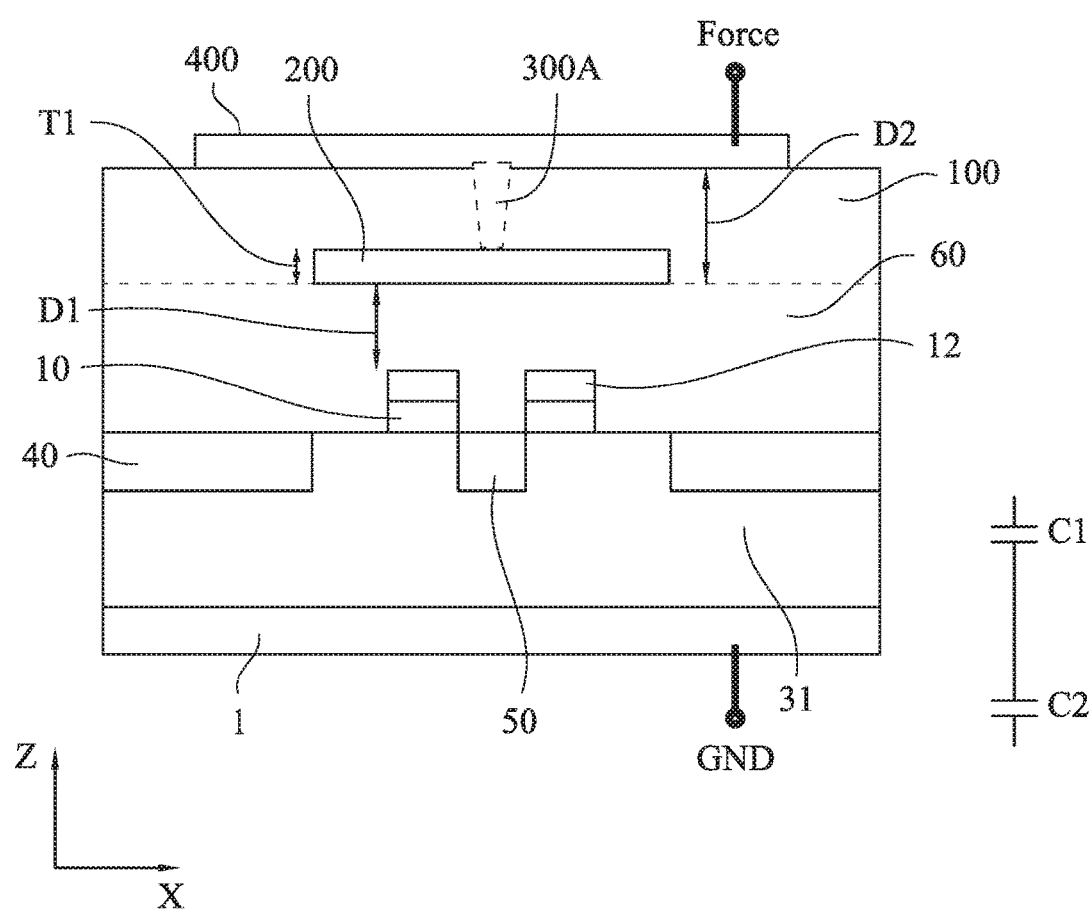
FIG. 3 shows a cross sectional view of a semiconductor device according to other embodiments of the present disclosure.

In some embodiments, instead of the doped second well 30, an intrinsic layer 31 is formed over the substrate 1 and/or the first well 20 as shown in FIG. 3. The intrinsic or non-doped semiconductor layer 31 may be formed by epitaxial growth without intentionally adding dopant. The impurity concentration of the intrinsic or non-doped semiconductor layer 31 is less than about $1\times10^{11}$ atoms/cm$^3$. In some embodiments, the intrinsic or non-doped semiconductor layer 31 is an epitaxially formed silicon layer.

FIGS. 4-11 show cross sectional views illustrating various stages of a sequential manufacturing process of the semiconductor device according to embodiments of the present disclosure. It is understood that additional operations can be provided before, during, and after the processes shown by FIGS. 4-11, and some of the operations described below can be replaced or eliminated, for additional embodiments of the method. The order of the operations/processes may be interchangeable.

FIGS. 4-7 show cross sectional views illustrating a resistor wire area corresponding to FIG. 2.

Figure 4:
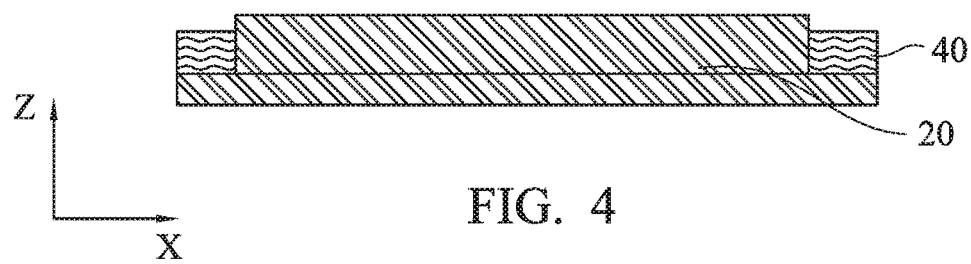
FIG. 4 shows one of various stages of a semiconductor device manufacturing process according to embodiments of the present disclosure.

As shown in FIG. 4, the first well 20 and an isolation insulating layer (STI) 40 are formed on the substrate. As set forth above, the first well 20 may be a fin structure extending in the X direction or may be a bulk layer (part of the substrate) surrounded by the isolation insulating layer 40. The first well 20 is formed by one or more ion implantation operations with or without a mask pattern.

Figure 5:
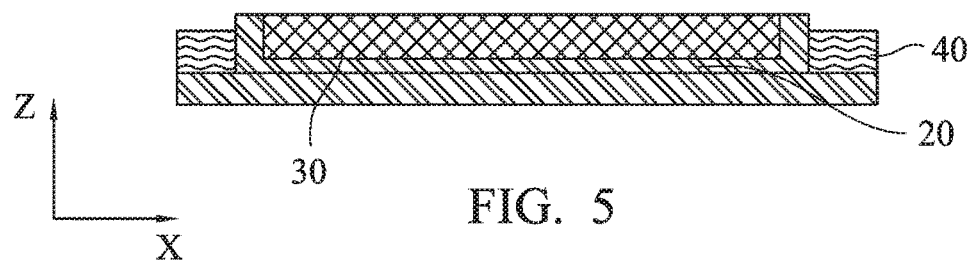
FIG. 5 shows one of various stages of a semiconductor device manufacturing process according to embodiments of the present disclosure.
Figure 6:
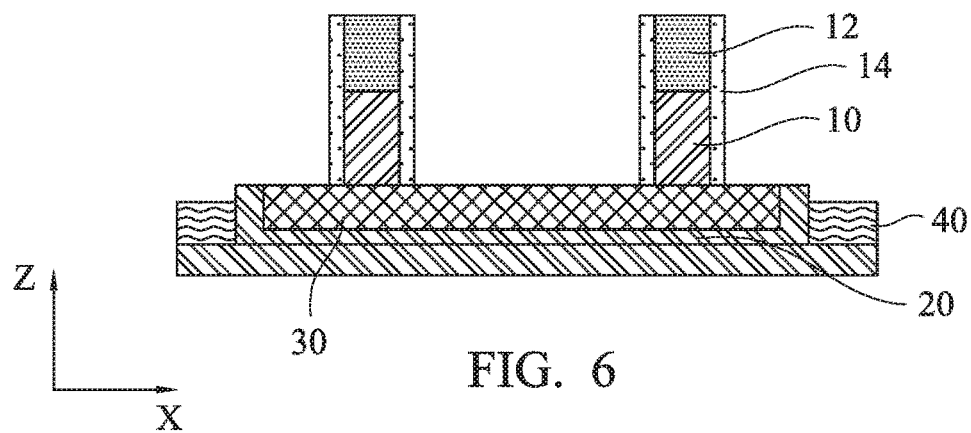
FIG. 6 shows one of various stages of a semiconductor device manufacturing process according to embodiments of the present disclosure.

Then, as shown in FIG. 5, the second well 30 is formed in the first well 20. The second well 30 is formed by one or more ion implantation operation with or without a mask pattern.

Subsequently, the gate structure 10 with the gate cap insulating layer 12 provided on the gate structure 10 is formed. In the resistor wire area, the gate structure 10 is a dummy gate. Further, sidewall spacers 14 are formed on opposing sides of the gate structure 10.

In some embodiments, the gate structure 10 is a metal gate structure formed by a gate replacement technology. In other embodiments, the gate structure 10 is formed by polysilicon.

Figure 7:
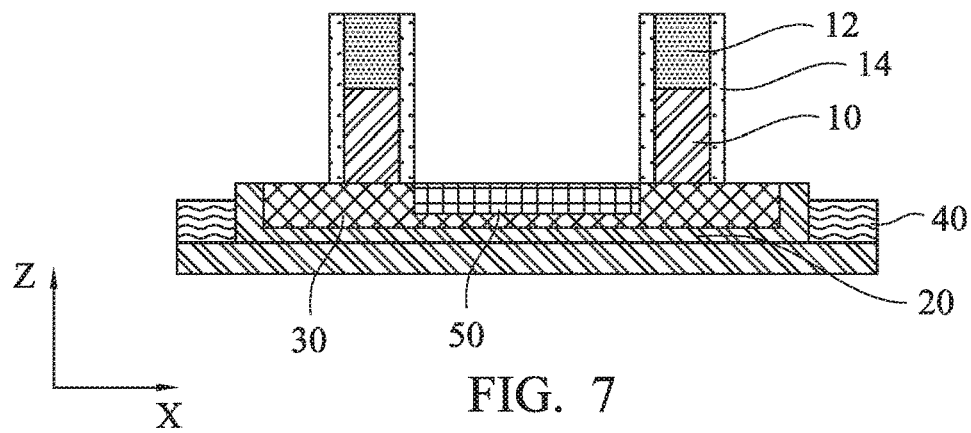
FIG. 7 shows one of various stages of a semiconductor device manufacturing process according to embodiments of the present disclosure.

Next, as shown in FIG. 7, the first diffusion region 50 is formed by one or more ion implantation operations with or without a mask pattern. Although in FIG. 7, the first diffusion region 50 is formed only between two gate structures 10, the first diffusion regions are formed opposite sides of the gate structures in other embodiments. The first diffusion region 50 may be formed before the sidewall spacers 14 are formed.

FIGS. 8-11 show cross sectional views illustrating the resistor wire area and a circuit area, in which active circuit elements are formed. FIGS. 8-11 illustrate not only the resistor wire area but also the circuit area including an active FET.

Figure 8:
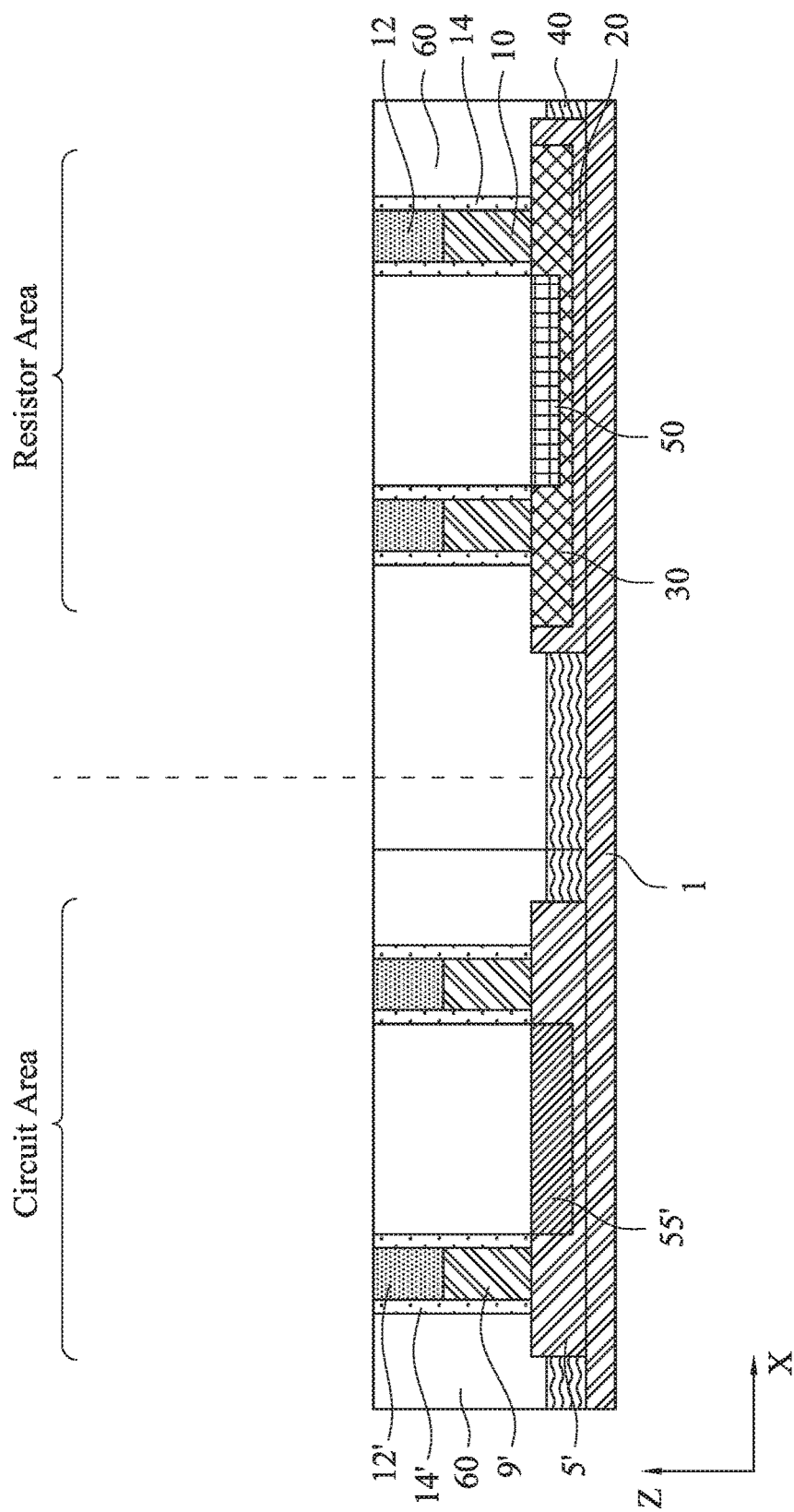
FIG. 8 shows a cross sectional view of a semiconductor device according to other embodiments of the present disclosure.

FIG. 8 shows a structure of a semiconductor device after the gate structures are covered with a first interlayer dielectric (ILD) layer 60. In the circuit area of FIG. 8, gate structures 9' are formed over a channel layer, for example, a part of a fin structure 5', and cap insulating layers 12' are disposed over the gate structures 9'. In some embodiments, the gate structure 9' is a metal gate structure including a high-k gate dielectric layer. The fin structure 5' protrudes from the isolation insulating layer 40. The thickness of the metal gate structures 9' is in a range from 15 nm to 50 nm in some embodiments. The thickness of the cap insulating layer 12' is in a range from about 10 nm to about 30 nm in some embodiments, and is in a range from about 15 nm to about 20 nm in other embodiments. Sidewall spacers 14' are provided on sidewalls of the metal gate structure 9' and the cap insulating layer 12'. The film thickness of the sidewall spacers 14' at the bottom of the sidewall spacers is in a range from about 3 nm to about 15 nm in some embodiments, and is in a range from about 4 nm to about 10 nm in other embodiments. The combination of the metal gate structure 9', the cap insulating layer 12' and sidewall spacers 14' may be collectively referred to as a gate structure. Further, source/drain (S/D) regions 55' are formed adjacent to the gate structures, and spaces between the gate structures are filled with the first ILD layer 60. The S/D regions 55' are a doped region and/or an epitaxially formed region with one or more semiconductor layers. In some embodiments, a silicide layer, such as WSi, CoSi, NiSi or TiSi, is formed on the S/D regions 55'.

Similarly, in the resistor area, substantially the same structure is formed. The dummy metal gate structures 10 are formed over the substrate, described above with respect to FIGS. 4-7.

In this embodiment, fin field effect transistors (Fin FETs) fabricated by a gate-replacement process are employed. The metal gate structure 9' and/or 10 includes one or more layers of metal material, such as Al, Cu, W, Ti, Ta, TiN, TiAl, TiAlC, TiAlN, TaN, NiSi, CoSi, other conductive materials. A gate dielectric layer disposed between the channel layer and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, one or more work function adjustment layers are interposed between the gate dielectric layer and the metal material. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 12, 12' includes one or more layers of insulating material such as silicon nitride based material including SiN, SiCN and SiOCN. The sidewall spacers 14, 14' are made of a different material than the cap insulating layer and include one or more layers of insulating material such as a silicon nitride based material including SiN, SiON, SiCN and SiOCN. The first ILD layer 60 includes one or more layers of insulating material such as a silicon oxide based material including silicon dioxide (SiO$_2$), SiON, SiCO or SiOCN, or other low-k materials.

The material of the sidewall spacers, the material of the cap insulating layers, and the material of the first ILD layer are different from each other, so that each of these layers can be selectively etched. In one embodiment, the sidewall spacers are made of SiOCN, SiCN or SiON, the cap insulating layers are made of SiN, and the first ILD layer 60 is made of SiO$_2$.

Figure 9:
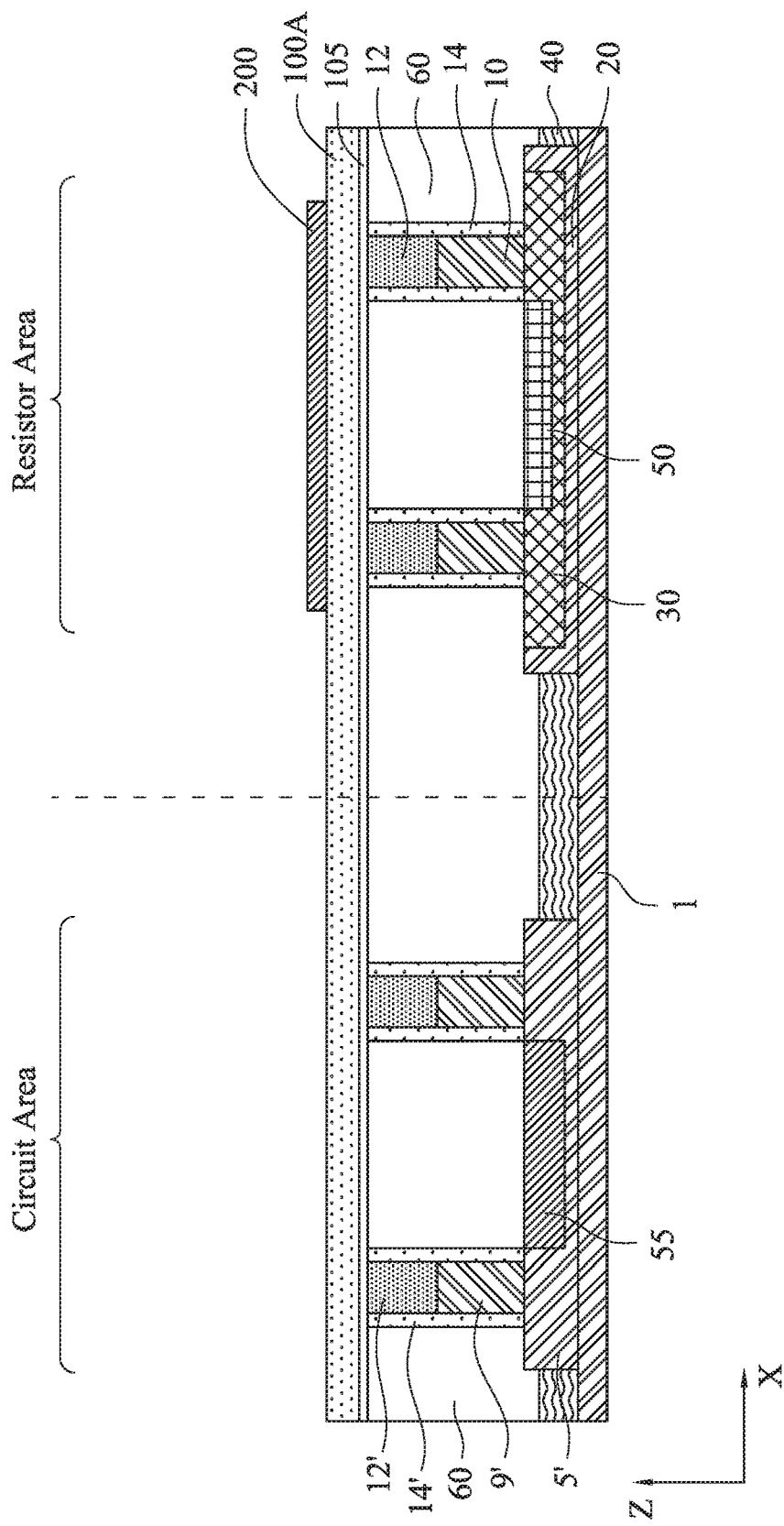
FIG. 9 shows a cross sectional view of a semiconductor device according to embodiments of the present disclosure.

Next, as shown in FIG. 9, a lower portion of a second ILD layer 100A is formed over the first ILD layer 60. In some embodiments, a first insulating layer 105, which functions as a first etch stop layer (ESL) in the subsequent contact hole etching operation, is disposed between the first ILD layer 60 and the lower portion of the second ILD layer 100A.

The first insulating layer 105 includes one or more layers of a silicon nitride based material, such as SiN, SiCN or SiOCN. The second ILD layer 100A includes one or more layers of insulating material such as silicon oxide based material such as silicon dioxide (SiO$_2$), SiON, SiCO or SiOCN, or other low-k materials.

After forming the lower portion of the second ILD layer 100A, a resistor wire 200 is formed on the lower portion of the second ILD layer 100A, as shown in FIG. 9. A blanket layer of a conductive material is formed over the lower portion of the second ILD layer 100A, and a patterning operation is performed so as to obtain the resistor wire 200. The blanket layer may be formed by CVD, physical vapor deposition (PVD) including sputtering or other suitable film formation methods.

Figure 10:
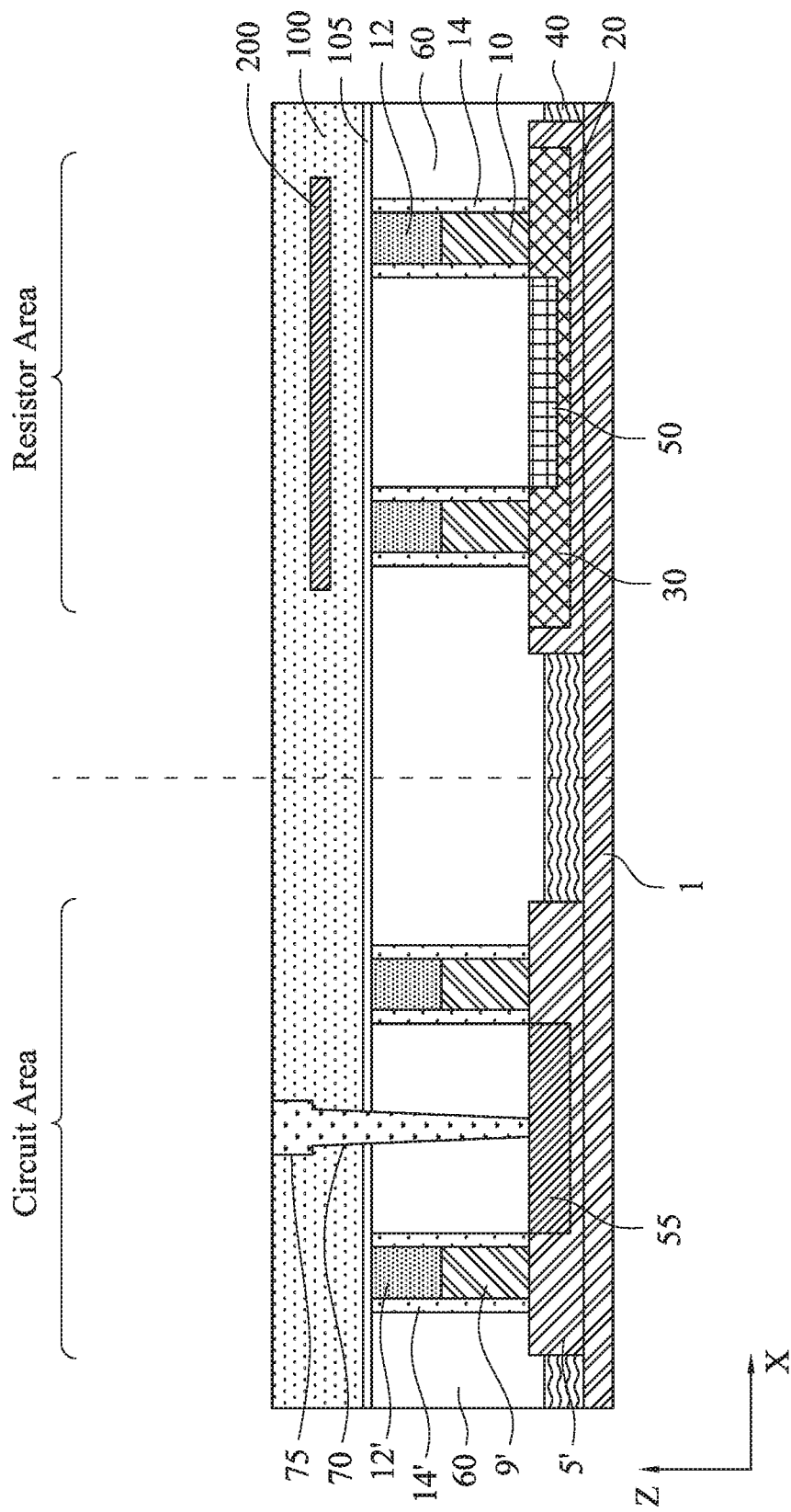
FIG. 10 shows a cross sectional view of a semiconductor device according to embodiments of the present disclosure.

Subsequently, the upper portion of the second ILD layer is formed over the lower portion 100A of the second ILD layer, and the resistor wire 200 is embedded in the second ILD layer 100, as shown in FIG. 10. In some embodiments, in the circuit area, a first contact plug 70 and a first metal wiring 75 are formed by using, for example, a dual damascene process, as shown in FIG. 10. The first contact plug 70 and the first metal wiring 75 include one or more layers of Cu, Al, Ti, Co, W or Ni, or alloys thereof, or TiN or TaN.

Figure 11:
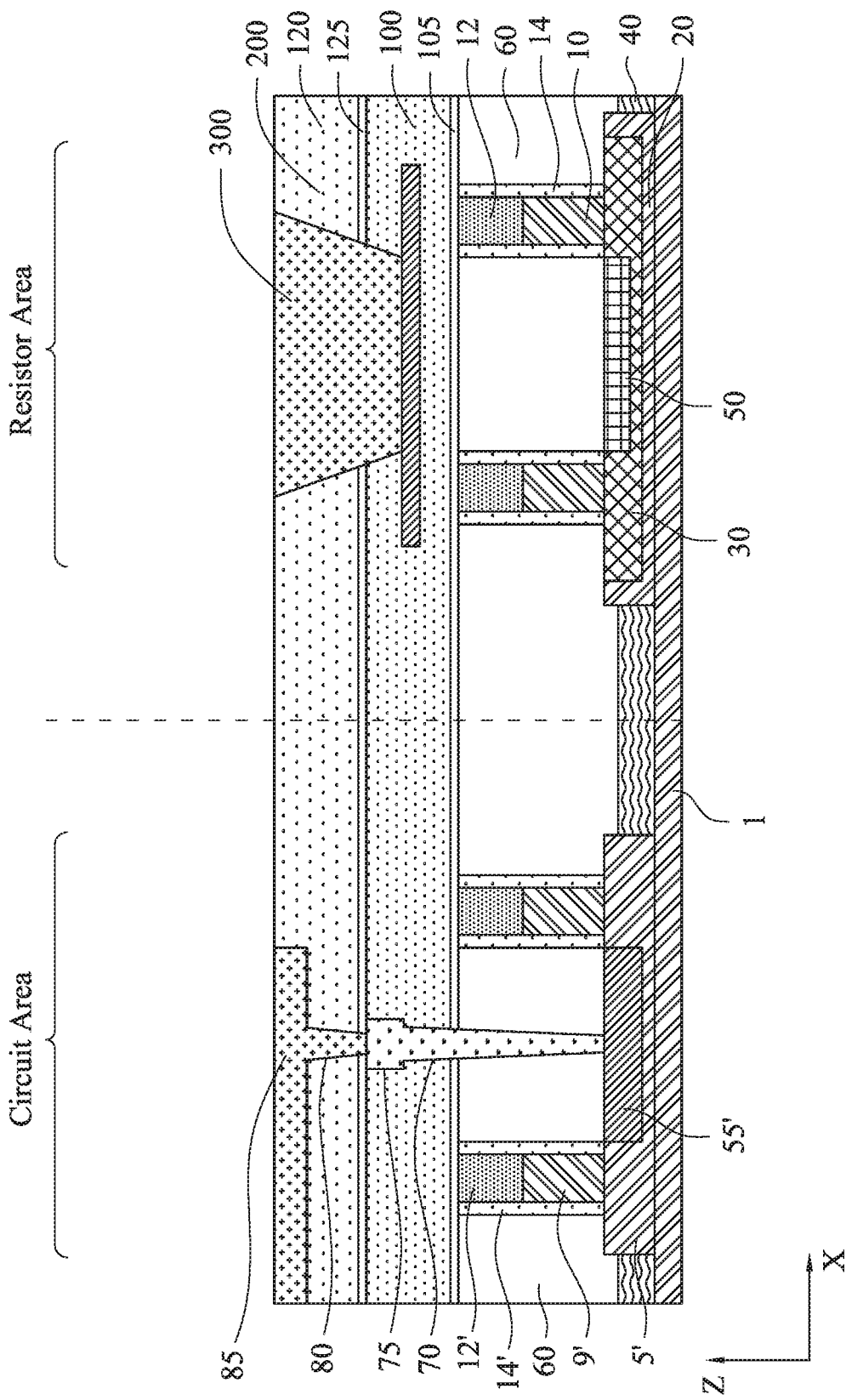
FIG. 11 shows a cross sectional view of a semiconductor device according to embodiments of the present disclosure.

Further, as shown in FIG. 11, a third ILD layer 120 is formed over the second ILD layer 100. In some embodiments, a second insulating layer 125, which functions as a second ESL in the subsequent contact hole etching operation, is disposed between the second ILD layer 100 and the third ILD layer 120. The materials or configuration of the third ILD layer 120 and the second ESL 125 are similar to those of the second ILD layer 100 and the first ESL 105.

After the third ILD layer 120 is formed, the contact 300 is formed connected to the resistor wire 200, as shown in FIG. 9A.

In some embodiments, in the circuit area, a second contact plug 80 and a second metal wiring 85 are formed by using, for example, a dual or single damascene process, as shown in FIG. 11. The contact 300 can be formed at the same time as the second contact plug 80 and/or the second metal wiring 85. The materials or configuration of the second contact plug 80 and the second metal wiring 85 are similar to those of the first contact plug 70 and the first metal wiring 75.

Figure 12:
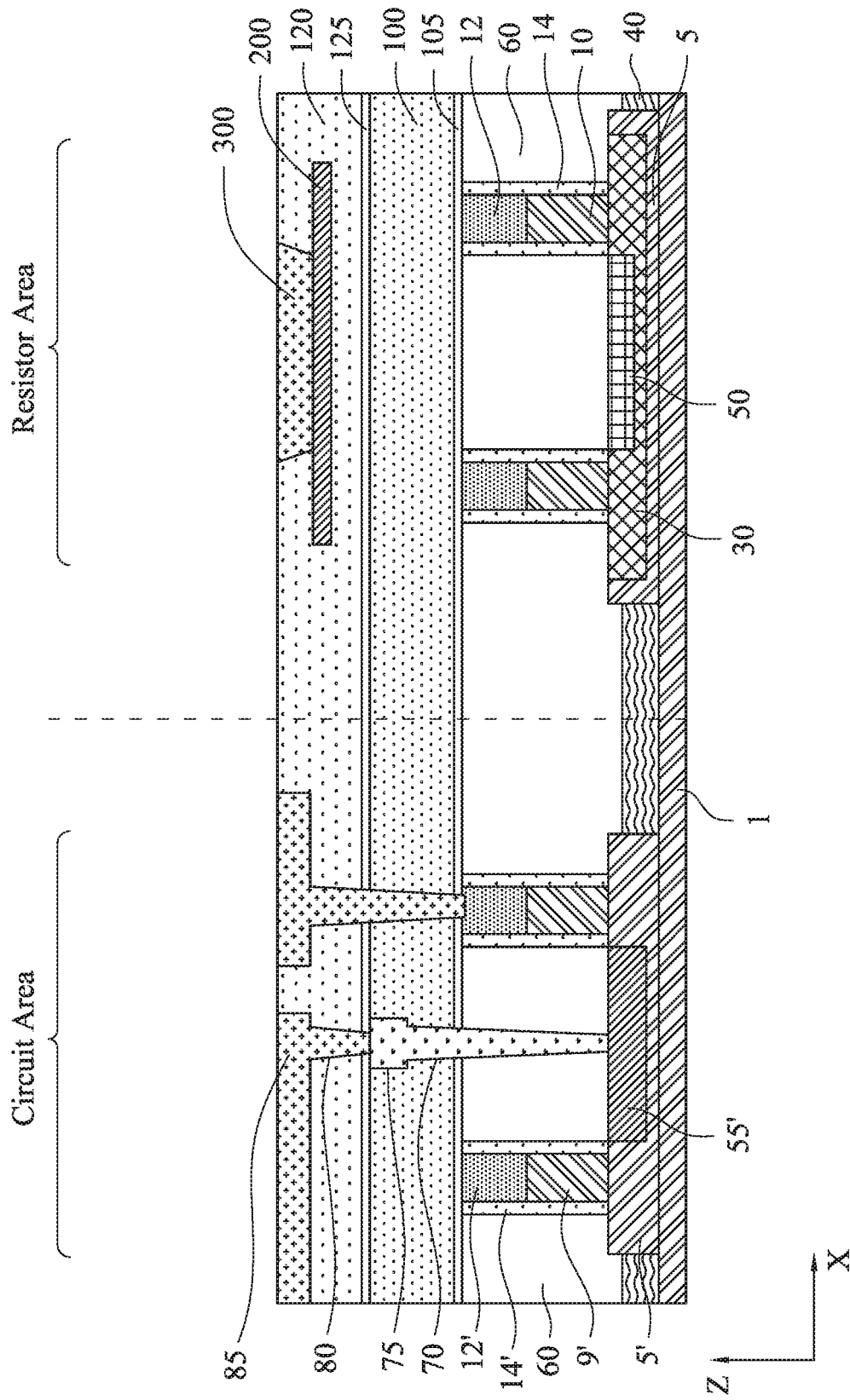
FIG. 12 shows a cross sectional view of a semiconductor device according to other embodiments of the present disclosure.

FIG. 12 shows another embodiment of the wiring structure. In FIG. 12, the resistor wire 200 is embedded in the third ILD layer 120.

After the structure of FIG. 8 is formed, a second ILD layer 100 and a first ESL 105 are formed over the first ILD layer 60. In some embodiments, in the circuit area, a first contact plug 70 and a first metal wiring 75 are formed. Then, a lower portion of the third ILD layer is formed over the second ILD layer 100. In some embodiments, a second insulating layer 125, which functions as a second ESL in the subsequent contact hole etching operation, is disposed between the second ILD layer 100 and the lower portion of the third ILD layer 120.

After forming the lower portion of the third ILD layer, the resistor wire 200 is formed on the lower portion of the third ILD layer 120. Subsequently, the upper portion of the third ILD layer 120 is formed over the lower portion of the third ILD layer, and the resistor wire 200 is embedded in the third ILD layer 120. Further, as shown in FIG. 12, a contact 300 is formed in the third ILD layer 120. In some embodiments, in the circuit area, a second contact plug 80 and a second metal wiring 85 are formed by using, for example, a dual damascene process. In some embodiments, the contact 300 is formed at the same time as the second contact plug 80 and/or the second metal wiring 85.

Figure 13:
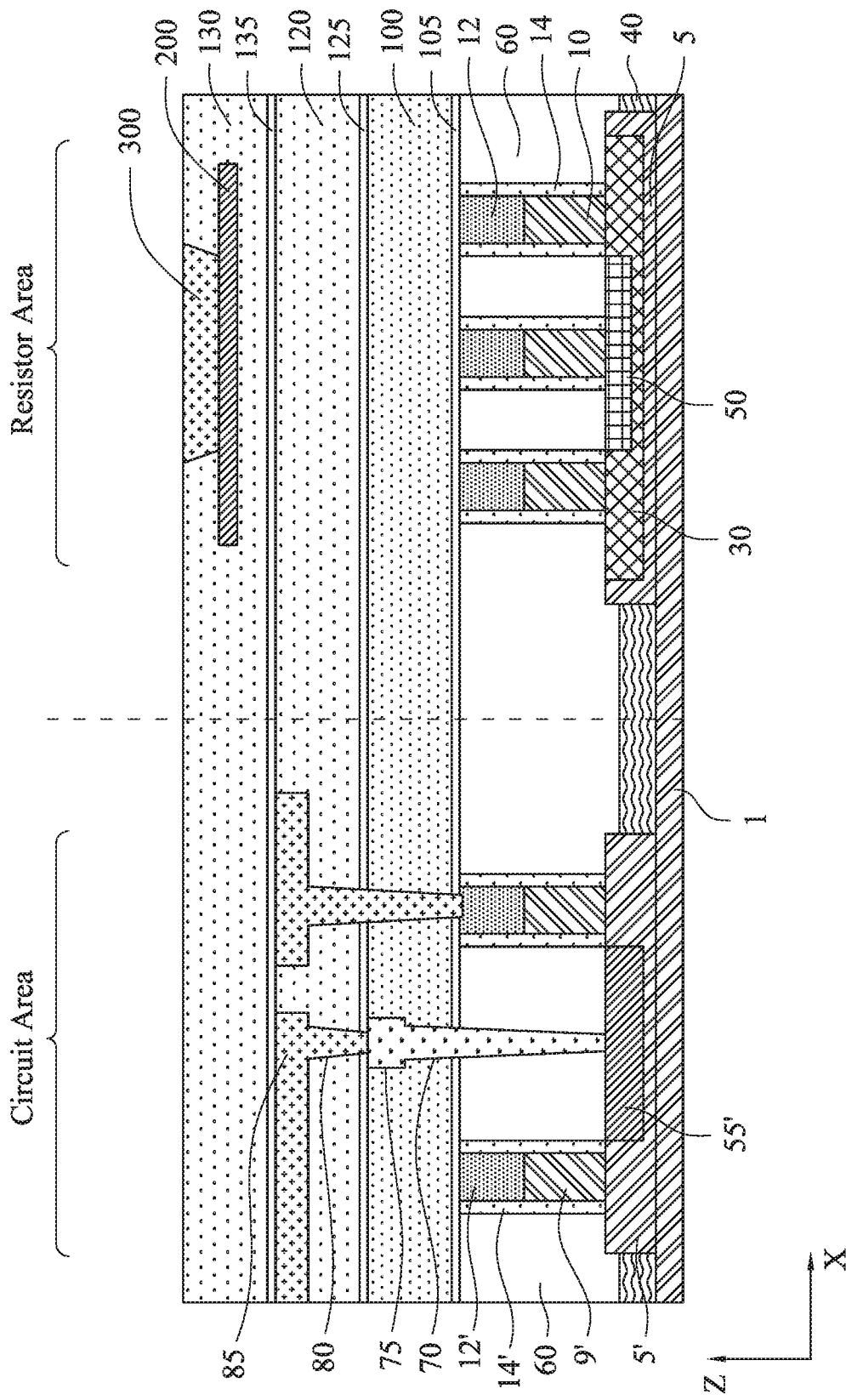
FIG. 13 shows a cross sectional view of a semiconductor device according to other embodiments of the present disclosure.

FIG. 13 shows a cross sectional view of another embodiment of the present disclosure. In FIG. 12, the resistor wire 200 is embedded in the upper (e.g., fourth) ILD layer 130.

After the structure of FIG. 10 is formed, a third ILD layer 120 and a second ESL 125 are formed over the second ILD layer 100. After the third ILD layer 120 is formed, in some embodiments, in the circuit area, a second contact plug 80 and a second metal wiring 85 are formed. Subsequently, by using the similar operations with respect to FIGS. 9-11, the fourth ILD layer 130, the resistor wire 200 and the contact 300 are formed, as shown in FIG. 13.

When one or more ILD layers are further formed below the ILD layer in which the resistor wire 200 is formed, the aforementioned operations are repeated.

It is understood that the devices shown in FIGS. 11, 12 and 13 undergo further CMOS processes to form various features such as interconnect metal layers, dielectric layers, passivation layers, etc.

In the foregoing embodiments, the resistor wire 200 extends in the Y direction. But, the layout of the resistor wire 200 is not limited to this layout and some of the resistor wires 200 extend in the X direction.

The various embodiments or examples described herein offer several advantages over the existing art. For example, in the present disclosure, under the resistor wire, two capacitances C1 and C2 connected in series are formed. The first capacitance C1 is formed between the resistor wire and the first diffusion region (e.g., p-type), and the second capacitance C2 is formed between the first diffusion region and the second well (e.g., n-type) and/or the first well (e.g., p-type) (and the substrate (e.g., p-type)). The series-connected capacitances can reduce the overall parasitic capacitance between the resistor wire and the substrate. The parasitic capacitance between the resistor wire and the substrate can be reduced by 44% compared with the case where the second well is a p-type, the same as the first well and the substrate.

It will be understood that not all advantages have been necessarily discussed herein, no particular advantage is required for all embodiments or examples, and other embodiments or examples may offer different advantages.

According to one aspect of the present disclosure, a semiconductor device includes a substrate having a first conductivity type, a first well formed in the substrate and having a second conductivity type, a first diffusion region formed in the first well and having the first conductivity type, a first interlayer dielectric layer disposed over the first well and the first diffusion region, and a resistor wire formed of a conductive material and embedded in the first interlayer dielectric layer. The resistor wire overlaps the first diffusion region and at least partially overlaps the first well in plan view.

According to another aspect of the present disclosure, a semiconductor device includes a substrate having a first conductivity type, an intermediate layer formed over the substrate and made of non-doped or intrinsic semiconductor, a first diffusion region of the first conductivity type formed in the intermediate layer, a first interlayer dielectric layer disposed over the intermediate layer and the first diffusion region, and a resistor wire formed of a conductive material and embedded in the first interlayer dielectric layer. The resistor wire overlaps the first diffusion region and at least partially overlaps the intermediate layer in plan view In accordance with yet another aspect of the present disclosure, in a method of manufacturing a semiconductor device, a first well is formed in a substrate. The substrate has a first conductivity type and the first well has a second conductivity type. A first diffusion region having the first conductivity type is formed. A first interlayer dielectric (ILD) layer is formed over the first well and the first diffusion region. A resistor wire is formed over the first ILD layer. A second interlayer dielectric layer is formed over the first interlayer dielectric layer and the resistor wire. The resistor wire is made of a conductive material, and the resistor wire overlaps the first diffusion region and at least partially overlaps the first well in plan view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a first conductivity type;
    an isolation insulating layer formed in the substrate;
    a first well formed in the substrate and having a second conductivity type, a part of the first well extending below the isolation insulating layer;
    a first diffusion region formed in the first well and having the first conductivity type;
    a first interlayer dielectric layer disposed over the first well and the first diffusion region;
    a dummy structure disposed over the first well; and
    a resistor wire formed of a conductive material and embedded in the first interlayer dielectric layer,
    wherein the resistor wire overlaps the first diffusion region and at least partially overlaps the first well in plan view, and
    the first well is electrically floating, and
    the resistor wire overlaps the dummy structure in plan view.

2. The semiconductor device of claim 1, wherein the conductive material of the resistor wire includes a transition metal nitride.

3. The semiconductor device of claim 1, wherein the conductive material of the resistor wire includes at least one of TiN, TaN, W and Co.

4. The semiconductor device of claim 1, wherein:
    the dummy structure includes two or more dummy gate electrodes disposed over the first well and extending in a first direction and arranged in a second direction perpendicular to the first direction, and
    the resistor wire extends in the first direction.

5. The semiconductor device of claim 4, wherein the resistor wire is longer than the dummy gate electrodes along the first direction.

6. The semiconductor device of claim 4, wherein:
    the dummy structure includes two dummy gate electrodes, and
    the first diffusion region is disposed between the two dummy gate electrodes.

7. The semiconductor device of claim 1, wherein the first conductivity type is p-type and the second conductivity type is n-type.

8. The semiconductor device of claim 1, further comprising a second well of the second conductivity type formed in the substrate,
    wherein the first well is formed in the second well.

9. A semiconductor device, comprising:
    a substrate having a first conductivity type;
    an intermediate layer formed over the substrate and made of non-doped or intrinsic semiconductor;
    a first diffusion region of the first conductivity type formed in the intermediate layer;
    a first interlayer dielectric layer disposed over the intermediate layer and the first diffusion region;
    a resistor wire formed of a conductive material and embedded in the first interlayer dielectric layer,
    wherein the resistor wire overlaps the first diffusion region and at least partially overlaps the intermediate layer in plan view.

10. The semiconductor device of claim 9, further comprising a dummy structure disposed over the intermediate layer,
    wherein the resistor wire overlaps the dummy structure in plan view.

11. The semiconductor device of claim 9, wherein the conductive material of the resistor wire includes a nitride of a transition metal.

12. The semiconductor device of claim 9, wherein the conductive material of the resistor wire includes at least one of TiN, TaN, W and Co.

13. The semiconductor device of claim 9, wherein:
the dummy structure includes two or more dummy gate electrodes disposed over the intermediate layer and extending in a first direction and arranged in a second direction perpendicular to the first direction, and
the resistor wire extends in the first direction.

14. The semiconductor device of claim 13, wherein the resistor wire is longer than the dummy gate electrodes along the first direction.

15. The semiconductor device of claim 13, wherein:
the dummy structure includes two dummy gate electrodes, and
the first diffusion region is disposed between the two dummy gate electrodes.

16. The semiconductor device of claim 9, wherein the first conductivity type is p-type.

17. A method of manufacturing a semiconductor device, the method comprising:
forming a first well in a substrate, the substrate having a first conductivity type and the first well having a second conductivity type;
forming a first diffusion region having the first conductivity type;
forming dummy gate electrodes made of a conductive material over the first well;
forming a first interlayer dielectric (ILD) layer over the first well, the first diffusion region and the dummy gate electrodes;
forming a resistor wire over the first ILD layer;
forming a second interlayer dielectric layer over the first interlayer dielectric layer and the resistor wire, wherein:
the resistor wire is made of a conductive material, and
the resistor wire overlaps the first diffusion region and at least partially overlaps the first well in plan view.

18. The method of claim 17, wherein the conductive material of the resistor wire includes at least one of TiN, TaN, W and Co.

19. The method of claim 17, wherein each of the dummy gate electrodes includes a metal gate electrode and a cap insulating layer.

* * * * *